United States Patent [19]

Zabler et al.

[11] 4,322,727

[45] Mar. 30, 1982

[54] INDUCTIVE TRANSDUCER RESPONSIVE TO DISPLACEMENT ALONG A PATH

[75] Inventors: Erich Zabler, Karlsruhe; Konrad Wolf, Walzbachtal, both of Fed. Rep. of Germany

[73] Assignee: Robert Bosch GmbH, Stuttgart, Fed. Rep. of Germany

[21] Appl. No.: 202,636

[22] Filed: Oct. 31, 1980

[30] Foreign Application Priority Data

Oct. 3, 1979 [DE] Fed. Rep. of Germany ....... 2944472

[51] Int. Cl.³ ............................................ G08C 19/08
[52] U.S. Cl. ............................. 340/870.35; 324/208; 336/45; 340/870.16
[58] Field of Search ................. 340/870.35, 870.31, 340/870.16; 336/45, 170; 324/208

[56] References Cited

U.S. PATENT DOCUMENTS 3,890,607  6/1975  Pelenc et al. ................. 340/870.35
4,132,980  1/1979  Zabler ........................... 340/870.35

*Primary Examiner*—Glen R. Swann, III

*Attorney, Agent, or Firm*—Frishauf, Holtz, Goodman & Woodward

[57] ABSTRACT

The variable inductor and the comparison inductor of a semi-differential variable inductance both have a pair of coils magnetically coupled together. The output current of an amplitude-controlled oscillator flows through the series combination of one coil of each pair and the other coil of the comparison inductor is used to supply a signal which is rectified in order to regulate the amplitude of the oscillator. The remaining coil, the other coil of the variable inductor, is connected in reverse polarity and in series with the coil last previously mentioned to provide, through a rectifier, an ouptut signal representative of the difference between the variable and comparison inductances normalized to (divided by) the comparison inductance. The output variation corresponds to the displacement of the short-circuiting ring of the variable inductance, which is mechanically linked to the control rod of a fuel injector of a diesel engine as required for a system controlling the fuel injector. The oscillator and the rectifiers can conveniently use operational amplifiers of the same type designation.

4 Claims, 3 Drawing Figures

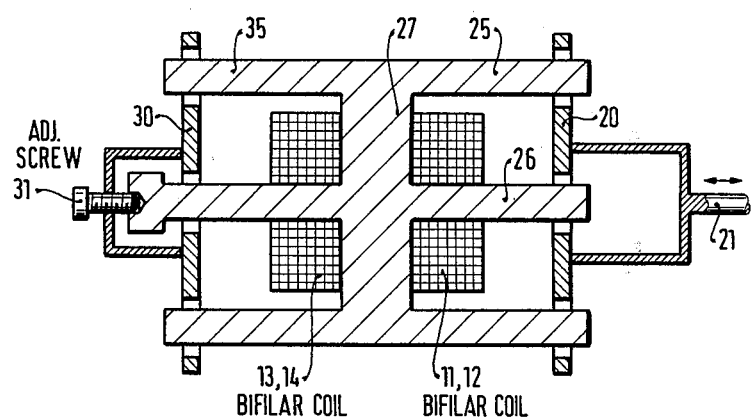

INDUCTIVE TRANSDUCER RESPONSIVE TO DISPLACEMENT ALONG A PATH

BACKGROUND OF THE INVENTION

This invention concerns an inductive displacement transducer suitable for indicating the displacement of a control rod in an internal combustion engine, for example the control rod of a fuel injection mechanism determining the amount of fuel injected per cycle in an engine cylinder. In particular the invention concerns the kind of transducer that utilizes a semi-differential variable inductance in which inductance variation is produced by mechanical motion of a short-circuiting ring along a magnetic core providing a magnetic path for the inductor. By a semi-differential variable inductance is meant a variable inductance unit which includes also a comparison inductance independently adjustable but kept at a fixed setting in the use of the unit. Semi-differential circuits do not have the degree of balance that full differential circuits have, for example FIGS. 8 and 9 of U.S. Pat. No. 4,132,980 where the inductance of one winding is reduced as that of another winding is increased.

It is known to use a semi-differential inductance unit combining a variable inductor responsive to mechanical displacement and an independent comparison inductor, together with an evaluation circuit by which a signal representative of the displacement is obtained. Apparatus of this type is useful, in the electronic control of a diesel engine, for determining distances of travel and angles, particularly with respect to the control rod of a fuel injection pump. In such an arrangement the short-circuiting ring of the variable inductor is coupled to the control or regulation member of the pump so as to move with it. The evaluation circuit needed by apparatus of this type heretofore known is quite complicated on account of the necessity of taking into account the comparison inductance as well as the variable inductance in continuous measurement. In our copending application Ser. No. 190,490, filed Sept. 25, 1980, we disclosed a much simpler circuit capable of providing, with a semi-differential variable inductor, a signal indicative of the ratio of the variable to the comparison inductance. It is desirable, however, to provide a signal more sensitive to variation in displacement.

SUMMARY OF THE INVENTION

It is an object of this invention to provide a transducer in which a semi-differential variable inductor is utilized in a simple circuit for evaluation of inductance changes and which will be able to provide in a simple fashion a signal highly sensitive to the displacement that actuates the variable inductor.

Briefly, the apparatus is connected to measure the ratio of the normalized inductance difference between the variable and comparison inductances. For this purpose, both the comparison inductor and the variable inductor of the semi-differential inductance unit are constituted of two coils electromagnetically coupled to each other, one of the coils of each of these inductors being connected in series and together interposed between the output terminal of an amplitude controlled oscillator and a reference potential such as ground potential, while the other coil of the comparison inductor provides the input to a first rectifier of which the output provides the amplitude control of the oscillator. The second coil of the variable inductor is connected in reverse polarity and in series with the second coil of the comparison inductor to provide a signal which is rectified in a second rectifier that produces the output of the apparatus, namely a signal representative of the ratio of the difference between the variable and comparison inductances to the value of the comparison inductance.

A particularly advantageous form of the apparatus is one in which the two rectifiers and the oscillator are both built around operational amplifiers of the same manufactured type designation, suitably connected, in the case of the oscillator the operational amplifier serving to provide amplitude control of an oscillator that uses a cascaded pair of complementary transistors. The connection between the oscillator output and the semi-differential variable inductor is preferably through a capacitor.

The provision of a signal in terms of the difference between the variable and comparison inductances is more sensitive to variations in displacement of the short-circuiting ring of the variable inductor than a signal in terms of the value of the variable inductor.

BRIEF DESCRIPTION OF THE DRAWINGS

The invention is further described by way of illustrative example with reference to the annexed drawings, in which:

FIG. 3 is a diagrammatic view of a semi-differential variable inductance of the kind usable in the circuits of FIGS. 1 and 2.

DESCRIPTION OF THE PREFERRED EMBODIMENT

Figure 1:
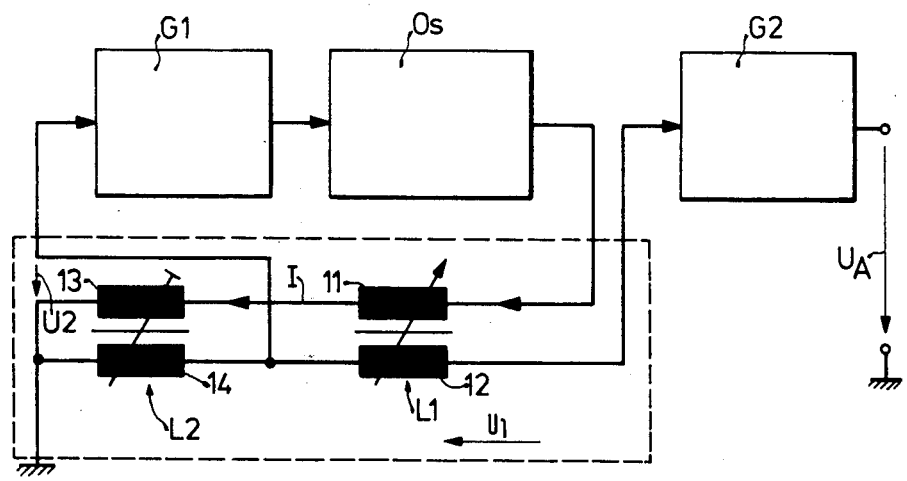
FIG. 1 is a simplified block diagram of a transducer apparatus according to the invention.
Figure 2:
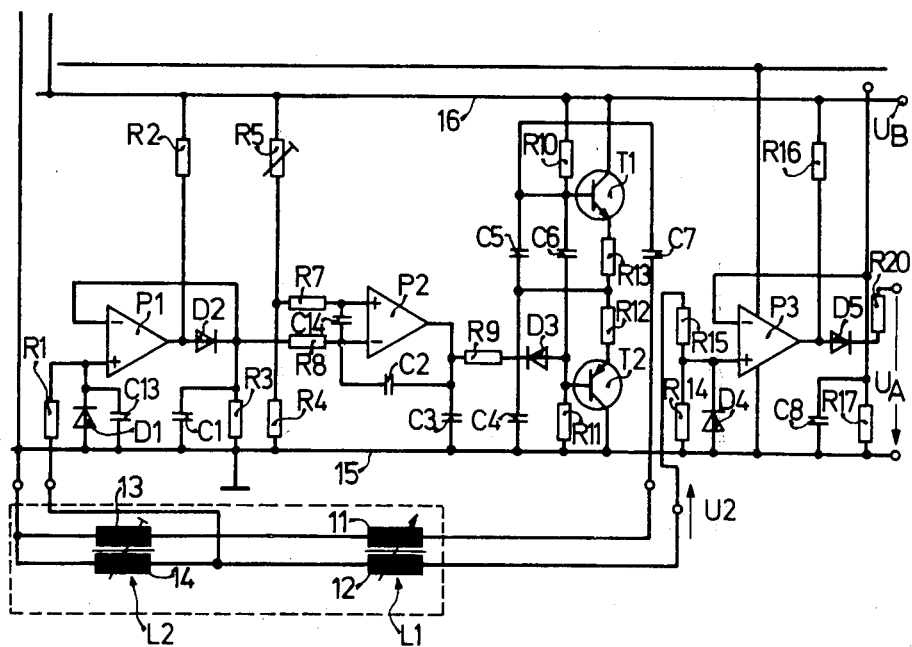
FIG. 2 is a circuit diagram of a preferred embodiment of the apparatus of FIG. 1.

FIGS. 1 and 2 relate to apparatus for measuring, in terms of an electrical output signal, a mechanical displacement, in particular the length of travel to or from a reference point on the path of travel of the control rod (not shown) of a fuel injection pump of a diesel engine. The transducer apparatus is built around a semi-differential variable inductance of the short-circuiting ring type illustrated in FIG. 3 of which the short-circuiting ring 20 is connected by a rod 21 to the fuel injection pump control rod (not shown). The illustrated apparatus is usable as a displacement transducer for any of a wide variety of machine-control members, as well as for providing remote indication of the position of various kinds of measuring instruments of which the output is a mechanical displacement.

As shown in FIG. 1, the variable inductor portion of the semi-differential device is provided with two measuring windings 11 and 12 that are magnetically coupled to each other and the comparison inductor portion likewise has two magnetically coupled windings 13 and 14. The inductance adjustment of the latter pair of coupled coils indicated in FIGS. 1 and 2 remains fixed at an inductance value L2 during operation of the device. The inductance L1 of the two measuring coils, on the other hand, is variable between a maximum and a minimum value according to the position of the short-circuit ring 20 (FIG. 3).

As shown in the block diagram given in FIG. 1, the evaluation circuit connected to the semi-differential variable inductance includes a first rectifying circuit G1, an amplitude regulated oscillator Os and a second rectifying circuit G2. At the output of the latter is available a voltage $U_A$, which is proportional to the ratio of the difference (L2−L1) between the variable and comparison inductances to the fixed value of inductance L2 of the comparison inductance.

The first coil 13 of the comparison inductor is connected in series with the first coil 11 of the variable inductor and the series combination is connected between a reference potential, such as ground, and the output of the oscillator Os. The current I flowing through these two coils generates an oscillating voltage U2 in the second coil 14 of the comparison inductor and this voltage is supplied to the rectifier circuit G1 to provide a signal that regulates the amplitude of the oscillation produced by the oscillator in such a way that an oscillating voltage U2 of constant amplitude appears at the input of the first rectifier circuit G1. The current I induces in the second coil 12 of the variable inductor an oscillating voltage U1 which is proportional to the inductance L1 of the variable inductor. By virtue of the reverse polarity in which the coil 12 of the variable inductor is connected in series with the coil 14 of the comparison inductor, the series connection of these two coils shown in FIGS. 1 and 2 produces an oscillating voltage of the magnitude of the difference between the voltages U1 and U2, normalized in terms of the constant oscillator amplitude represented by the voltage U2, and this voltage is supplied to the second rectifying circuit G2 to produce its output voltage UA which is representative of the ratio of the difference between the variable and comparison inductances to the value of the comparison inductances.

In more detail, as shown in FIG. 2, the first rectifier G1 is built around an operational amplifier P1, of which the non-inverting input is connected through a resistor R1 with the first comparison coil 14 and through a capacitor C13 and a diode D1 parallel thereto, over to the common grounded conductor 15 which establishes a reference potential. At the output of the first operational amplifier P1 is connected a resistor R2 through which a connection is made to the common positive potential supply bus 16, and also the anode of a second diode D2, of which the cathode is connected to a feedback connection to the inverting input of the operational amplifier and also to a network made up of the integrating capacitor C1 and the resistor R3 connected in parallel thereto, which network has its other terminal connected to ground bus 15. The DC voltage produced at the capacitor C1 is supplied through a resistor R8 to the inverting input of a second operational amplifier P2, of which the non-inverting input is connected through a series input resistor R7 to a voltage divider consisting of the two resistors R4 and R5, to which voltage divider the operating voltage UB is applied. The non-inverting input of the operational amplifier P2 is also connected through a capacitor C14 to the inverting input of the same operational amplifier. A feedback capacitor C2 connects the output and the inverting input of the second operational amplifier P2, that output also being connected to a capacitor C3, the other terminal of which is grounded to the ground bus 15. The output of the operational amplifier P2 is also connected through a resistor R9 and a diode D3 to the base of a pnp transistor T2 that has its collector electrode connected through the negative or ground bus 15 and its emitter connected through resistors R12 and R3 to the emitter of an npn transistor T1, which on its part has its collector connected to the positive potential bus 16.

The two emitter resistors R12 and R13 are connected to the tap of a capacitive voltage divider formed by the capacitors C5 and C4. The capacitor C5 is connected to the base of the transistor T1 and also through a further capacitor C7 to the first coil 11 of the variable inductor. A capacitor C6 is connected between the base of transistor T1 and the base of the transistor T2. The base of the transistor T1 is connected through a resistor R10 with the positive supply bus 16, whereas the base of the transistor T2 is connected through a resistor R11 to the negative supply bus 13. This connection of the complementary transistors T1 and T2 forms an oscillator circuit of which the amplitude is regulated by the output of the operational amplifier P2 applied to the base of the transistor T2 through the diode D3, thereby controlling the DC current through the transistors T1 and T2.

The oscillating voltage U1 induced in the second coil 12 of the variable inductor coupled magnetically with the first coil 11 thereof, is supplied through a resistor R15 to the non-inverting input of a third operational amplifier P3, which like the first operational amplifier P1 operates as a rectifier, in this case through a diode D5 and a resistor R20, supplies an output voltage $U_A$ that is proportional to the ratio (L1−L2/L2) of the difference between the variable and comparison inductances to the value of the comparison inductance. This output voltage is held at a storage capacitor C8 which has a discharge resistor R17 connected in parallel to it.

The non-inverting input of the third operational amplifier P3 is connected, through a resistor R14 and a diode D4 pulled in its blocking direction, with the common negative bus 15. The output of this operational amplifier is connected through a resistor R16 to the common positive bus 16.

Inductive transducers of the displacement-indicating short-circuit ring type are disclosed and explained in U.S. Pat. No. 4,132,980, the disclosure of which is hereby incorporated by reference. FIG. 8 of that patent describes a differential inductance device of that kind. For the present invention, it has been found effective to use a semi-differential variable inductance of the same general kind, the structure of which is illustrated in FIG. 3 hereof in the same manner as the structure of other devices is shown in U.S. Pat. No. 4,132,980.

The variable inductor in FIG. 3 comprises the core 25 on the central leg 26 of which, near the yoke 27, is mounted a bifilar coil designated 11, 12, because it consists of the pair of coils 11, 12 wound bifilarly for effective coupling with each other and identical reaction to the displacement of the short-circuit ring 20 in response to the movement of a connecting rod 21. The comparison inductor has a core 35 on which is similarly mounted the bifilar of coil 13,14, the short-circuiting ring 30 in this case being maintained in a fixed position that is subject to adjustment by the screw 31. The coils are mounted mechanically together as a unit by a means not shown, for example a casing including a mounting plate passing between the cores 25 and 35 made of non-magnetic material, for example of plastic. The windings are connected as shown in FIGS. 1 and 2.

The particular advantage of the invention lies in that the output voltage $U_A$ is proportional to the difference between the variable inductance L1 and the comparison inductance L2 divided by the comparison inductance L2. Therefore, with a suitable choice of the comparison inductance it is possible to keep the offset voltage of $U_A$ very small and also to increase the voltage range of that output voltage, as is illustrated by the following example.

EXAMPLE

For $L_2 = 9/10$ (S min), there is obtained an offset voltage:

$$U_A (S\ min) = \frac{L1\ (S\ min) - \frac{9}{10} L1\ (S\ min)}{\frac{9}{10} L1\ (S\ min)} U_2$$

$$U_A (S\ min) = \frac{1}{9} U_2$$

and an output voltage range V for L1 (S max)=3 L1 (S min):

$$V = \frac{3\ L1\ (s\ min) - \frac{9}{10} L1\ (S\ min)}{L1\ (S\ min) - \frac{9}{10} L1\ (S\ min)} = 21 \geq 2000\%,$$

i.e. with an inductance range of 200% there is output voltage range of 2000%.

In the above formulae (S min) means a minimum value and (S max) means a maximum value of the path dimension S for the displacement of the short-circuit ring of the variable inductor.

If the illustrated embodiment of transducer apparatus is exposed to varying ambient temperature, the ohmic resistance of the windings 11, 12, 13 and 14, among other things, varies. The circuit of FIGS. 1 and 2, in contrast to the circuits heretofore known, measures the voltage induced in the comparison inductor winding 14 at high resistance without appreciable superimposed voltage drop from purely ohmic winding resistance and regulates the output voltage of the oscillator Os accordingly, so that only a small effect of temperature on the apparatus results.

Although the invention has been described with reference to a particular illustrative embodiment, it will be understood that modifications and variations are possible within the inventive concept. Thus, for example, it is not necessary to wind the coil pairs in bifilar fashion and it is likewise not necessary for the adjustment of the comparison inductor to use an adjustment that operates on a shortcircuiting ring or plate.

We claim:

1. Inductive transducer apparatus suitable for indicating the displacement of the fuel injection control rod in an internal combustion engine and utilizing a semi-differential variable inductance including an adjustable comparison inductor and a variable inductor having a short-circuiting ring movable by a member of which the displacement along a path is to be measured, and further comprising the improvement which consists in that:

both said comparison inductor and said variable inductor of said semi-differential inductance unit are constituted of a first and a second coil magnetically coupled to each other;

one of said coils of said variable inductor of said unit is connected in series with a first coil of said comparison inductor of said unit and the series combination thereof is connected between the output terminal of an amplitude- regulated oscillator and a reference potential;

the second of said coils of said comparison inductor is connected to supply a signal to a first rectifying circuit (G1) that provides an amplitude regulating magnitude to said oscillator (Os); and the second of said coils of said variable inductor of said unit is connected in series with the second of said coils of said comparison inductor to provide, in a polarity opposite to the polarity of the first of said coils of said variable inductor, a signal to a second rectifying circuit (G2), the output of which furnishes an output electrical signal representative of the ratio of the difference (L1−L2) between the inductances of said variable and comparison inductors to the inductance of said comparison inductor (L2).

2. Apparatus as defined in claim 1 in which said first rectifying circuit (G1), said amplitude-regulated oscillator (Os) and said second rectifying circuit (G2) are each provided with a suitably connected operational amplifier (P1, P2, P3) comprises identical interchangeable components.

3. Apparatus as defined in claim 2 in which said operational amplifier in (P2) of said amplitude-regulated oscillator serves as an amplitude regulator and has its output connected to an oscillator stage containing a pair of mutually complementary transistors (T1, T2) connected in series.

4. A transducer as defined in claim 3 in which said series combination of a coil of said variable inductor and a coil of said comparison inductor is connected to the output of said oscillator stage via a coupling capacitor (C7).

* * * * *

UNITED STATES PATENT AND TRADEMARK OFFICE
CERTIFICATE OF CORRECTION

PATENT NO. : 4,322,727
DATED : March 30, 1982
INVENTOR(S) : Erich ZABLER et al

It is certified that error appears in the above—identified patent and that said Letters Patent is hereby corrected as shown below:

On the title page under the heading "Foreign Application Priority Data" please correct the priority date of (DE) Fed. Rep. of Germany ..... 2944472 so that it reads November 3, 1979 instead of Oct. 3, 1979.

Signed and Sealed this

Twelfth Day of October 1982

[SEAL]

Attest:

Attesting Officer

GERALD J. MOSSINGHOFF

Commissioner of Patents and Trademarks